United States Patent [19]

Hardee et al.

[11] Patent Number: 4,660,178
[45] Date of Patent: Apr. 21, 1987

[54] MULTISTAGE DECODING

[75] Inventors: Kim C. Hardee; Mike J. Griffus, both of Colorado Springs, Colo.

[73] Assignee: Inmos Corporation, Colorado Springs, Colo.

[21] Appl. No.: 652,083

[22] Filed: Sep. 20, 1984

Related U.S. Application Data

[63] Continuation-in-part of Ser. No. 534,510, Sep. 21, 1983.

[51] Int. Cl.$^4$ ............................................. G11C 11/40
[52] U.S. Cl. .................................. 365/189; 365/230; 307/530
[58] Field of Search ................. 365/189, 230, 94, 103, 365/104; 307/463, 449, 465, 530

[56] References Cited

U.S. PATENT DOCUMENTS 3,609,708  9/1971  Cragon .................................. 365/94
3,678,475  7/1972  Jordan et al. ........................ 365/104
3,774,171  11/1971 Regitz ................................... 365/94
4,032,765  6/1977  Epstein et al. ...................... 365/103
4,104,735  8/1978  Hofmann et al. .................... 365/230
4,292,548  9/1981  Suarez et al. ....................... 307/465

FOREIGN PATENT DOCUMENTS 0035326  9/1981  European Pat. Off. .
1347438  2/1974  United Kingdom .

Primary Examiner—Terrell W. Fears
Attorney, Agent, or Firm—Edward D. Manzo; Roger R. Wise

[57] ABSTRACT

An improved row decoding technique for use in a static RAM. Three stages of row decoders are utilized to further decode partially decoded row address signals and combine the decoded signals with a column address signal to enable selected rows of the memory array. To optimize decoding speed, each stage comprises gates which receive only two inputs from the prior stage and the stages are arranged to allow for sharing of signals between adjacent decoders.

7 Claims, 4 Drawing Figures

MULTISTAGE DECODING

BACKGROUND OF THE INVENTION

This is a continuation-in-part of application Ser. No. 534,510 filed in the U.S. Patent and Trademark Office on Sept. 21, 1983, whose disclosure is incorporated hereby by reference.

The present invention is concerned with decoding in random access memories and in particular is concerned with a 64K memory.

An object of the invention is to provide an improved arrangement for decoding addresses.

DETAILED DESCRIPTION

Figure 1:
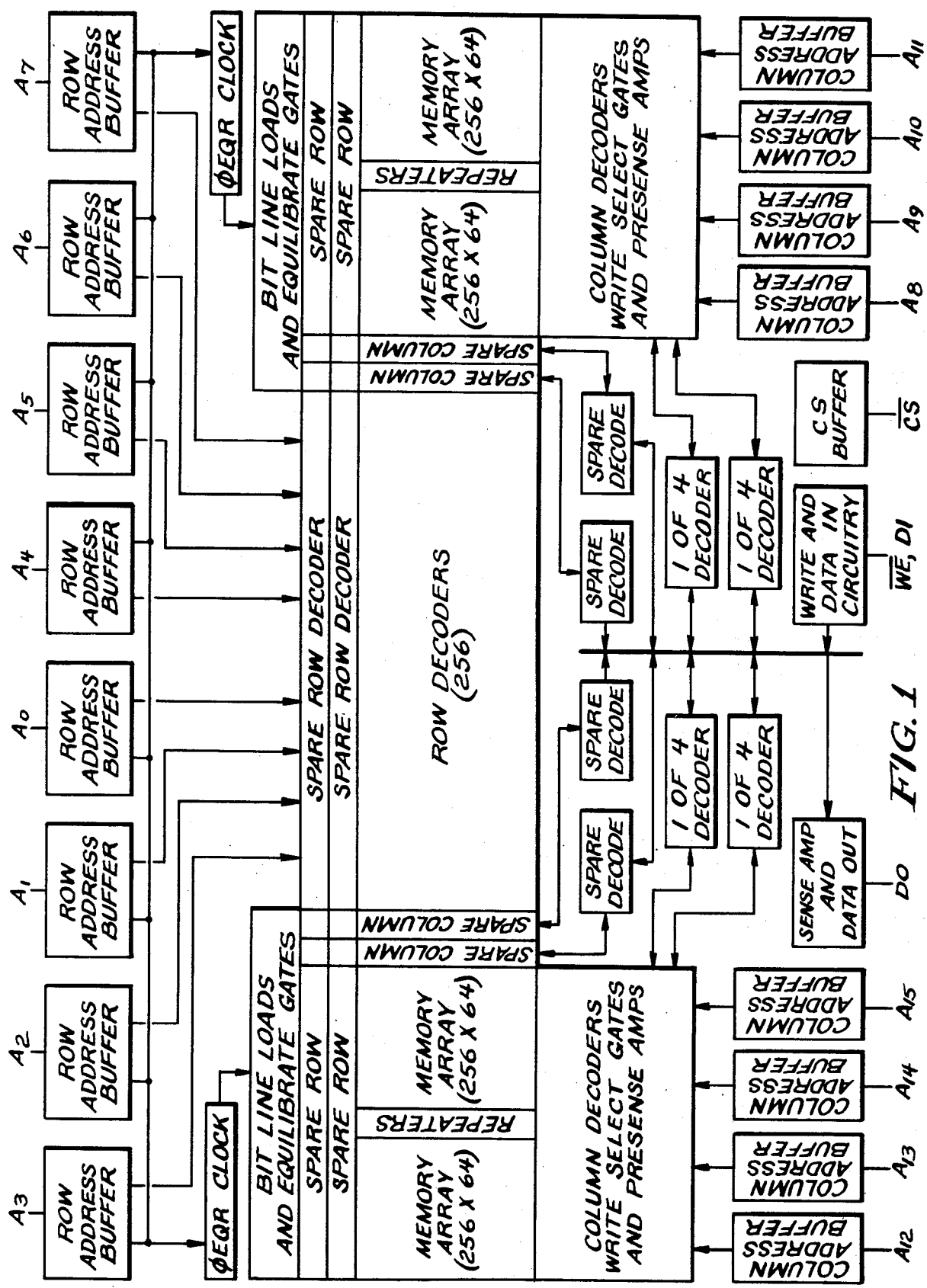
FIG. 1 is a block diagram of a RAM where the invention can be used.
Figure 2:
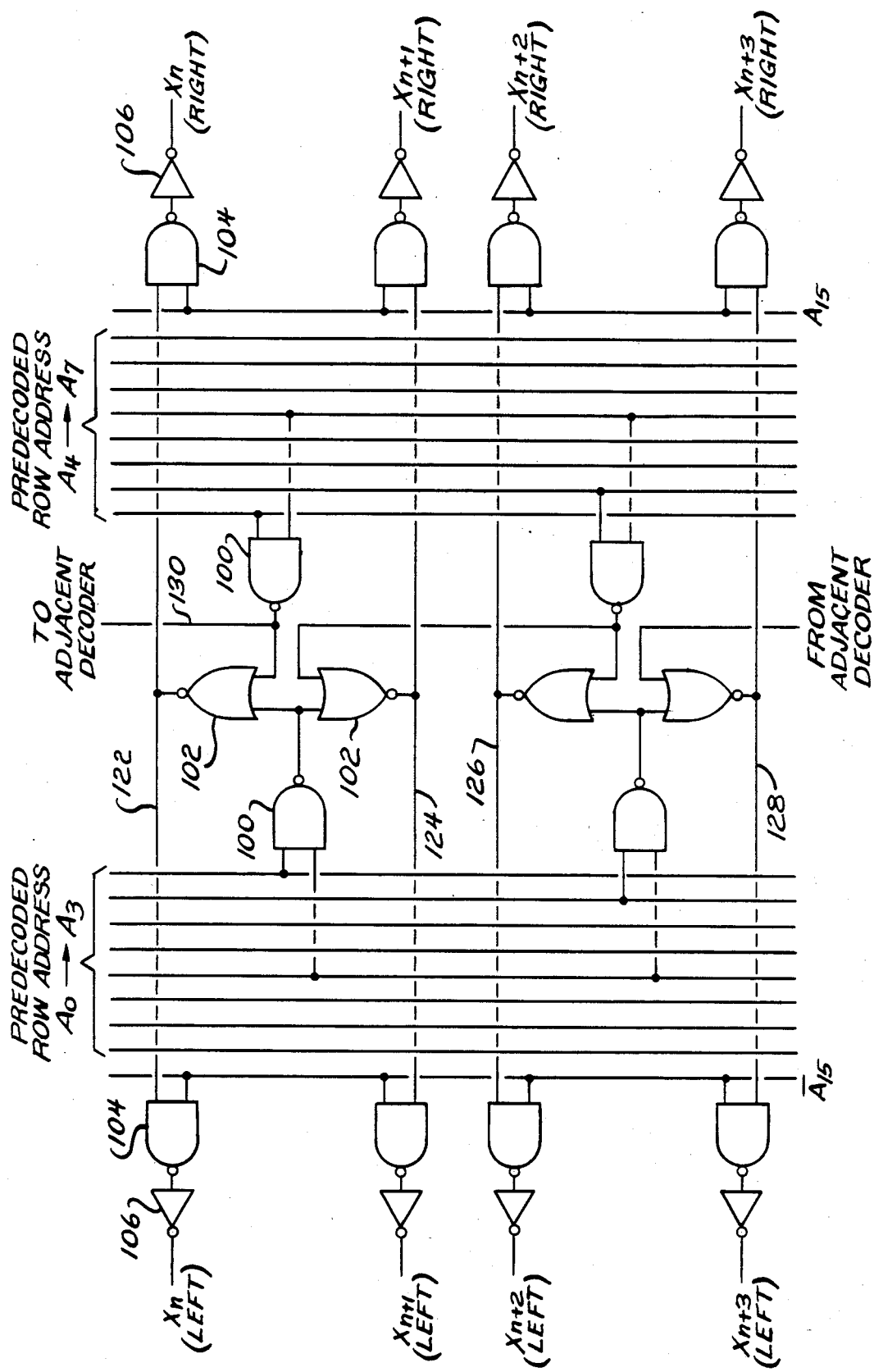
FIG. 2 shows the final stages of multistage decoding according to the present invention.
Figure 3:
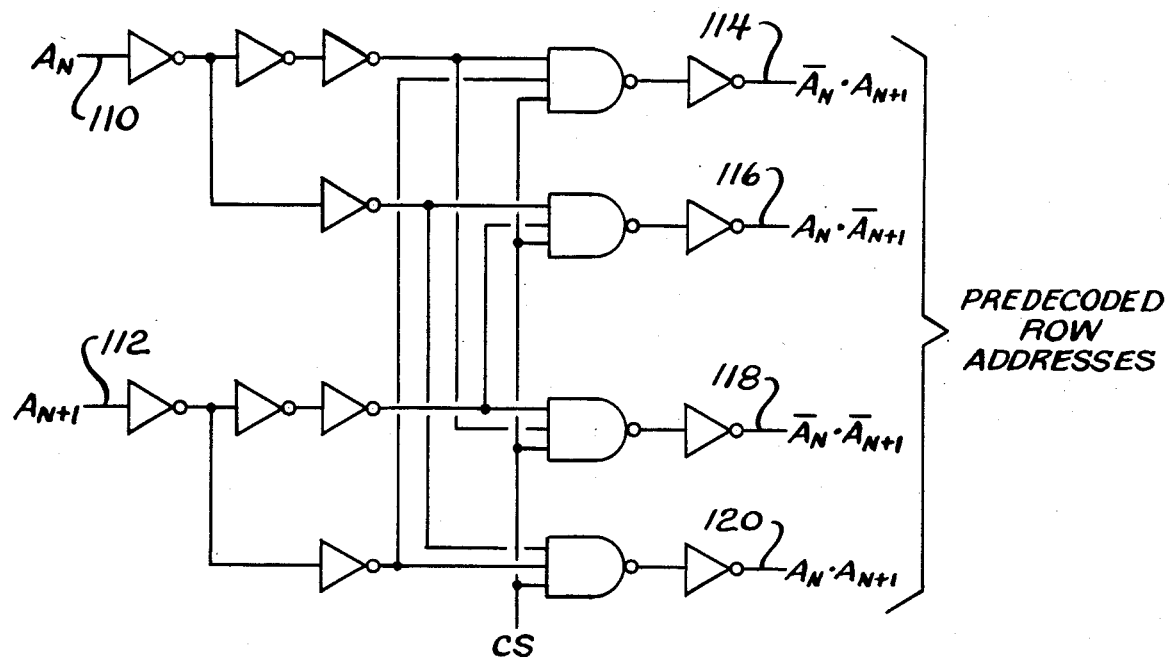
FIG. 3 shows a first stage of multistage decoding.
Figure 4:
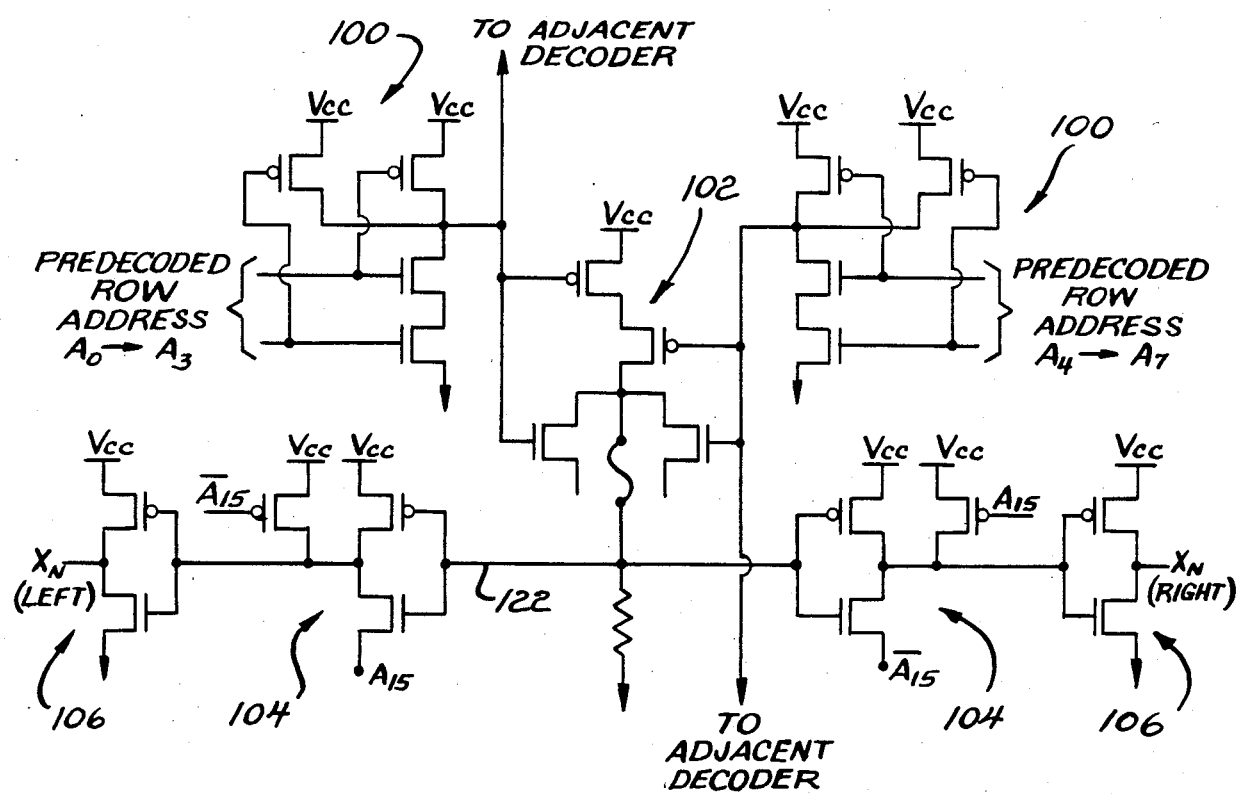
FIG. 4 shows a ciruit implementation of logic gates of FIG. 2.

The unique multi-stage decoding is illustrated in FIGS. 2, 3, and 4. It will be noted that each stage in FIG. 2 has only two inputs. This greatly improves the speed and the layout. As shown in FIG. 2, on the left there are nine lines, eight of which represent logical combinations for row addresses $A_0$ through $A_3$. On the right side, there are 8 lines for the rows $A_4$ through $A_7$. The ninth lines on the left and right are marked A15 and $\overline{A}_{15}$. The sixteen partially decoded row addresses are inputs from earlier stages. In FIG. 2, the first stage of decoding is a NAND gate 100 which receives signals from two of the predecoded row address lines. This is applied to the second stages which consist of two NOR gates 102. These each receive a second input from adjacent first stage decoders, and provide an output to the final stage 104 of decoding. Stage 104 selects whether the left half or the right half will be used. Its output is applied to a buffer inverter 106.

More particularly, the row address bits are received by logic circuitry similar to that shown in FIG. 3. $A_n$ and $A_{n+1}$ inputs on lines 110 and 112 represent paired row address bits, such as $A_0$ and $A_1$. These two bits are then processed through the various inverters and NAND gates as illustrated to develop four outputs $\overline{A}_n \cdot A_{n+1}$, $A_n \cdot \overline{A}_{n+1}$, $\overline{A}_n \cdot \overline{A}_{n+1}$ and $A_n \cdot A_{n+1}$ on lines 114, 116, 118 and 120, respectively. These outputs represent the result of a first stage of decoding of the paired row address bits $A_n$ and $A_{n+1}$.

In a system utilizing an eight bit ($A_0$–$A_7$) row address signal, four circuits such as shown in FIG. 3 would be used to provide a total of sixteen partially decoded row address signals for further processing. That is, $A_0$ and $A_1$ would be logically processed in one such circuit to provide four outputs representative of $\overline{A}_0 \cdot A_1$, $A_0 \cdot \overline{A}_1$, $\overline{A}_0 \cdot \overline{A}_1$, and $A_0 \cdot A_1$ on lines 114, 116, 118 and 120 respectively. Similarly, row address bits $A_2$ and $A_3$, $A_4$ and $A_5$ and $A_6$ and $A_7$ would be combined in other such circuits to each provide four further outputs on the appropriate lines for a total of sixteen partially decoded row address signals.

It is these sixteen partially decoded row address signals which provide inputs to the representational decoding circuitry of FIG. 2. The four $A_0A_1$ combination signals and the four $A_2A_3$ combination signals are received at the left of FIG. 2 on the lines labelled "Predecoded Row Address $A_0 \rightarrow A_3$." Similarly, the four $A_4A_5$ combination signals and the four $A_6A_7$ combination signals are received at the right of FIG. 2 on the lines labelled "Predecoded Row Address $A_4 \rightarrow A_7$."

The circuitry of FIG. 2 provides the final stages of the multistage decoding of the present invention. Left and right NAND gates 100 each receive two partially decoded inputs for further decoding. Left NAND gate 100 receives one $A_0A_1$ combination signal as one input and one $A_2A_3$ combination signal as its other input. Right NAND gate 100 receives one $A_4A_5$ combination signal as one input and one $A_6A_7$ combination signal as its other input. The outputs of left and right NAND gates 100 are further decoded through upper NOR gate 102 to drive row line 122 high or low, depending on whether it is the "addressed" row or not.

In this fashion, an eight bit row address signal is decoded through three stages (stage one in the logic circuitry of FIG. 3, stage two at NAND gate 100, and stage three at NOR gate 102) to excite the desired row address line, e.g., line 122. The use of this multistage decoding technique allows each stage to be optimized for the greatest possible operational speed. Because of the selective optimization of the individual stages, the multistage decoding technique of the present invention provides a faster chip access time than conventional methods which typically utilize a single-stage, eight-input decoding gate for each row line.

A further selection process is performed by left and right NAND gates 104 to decide whether $X_n$ left or right is to be excited. Row line 122 serves as one input to each NAND gate 104 with $\overline{A}_{15}$ being the other input to left NAND gate 104 and $A_{15}$ being the other input to right NAND gate 104. Because $A_{15}$ and $\overline{A}_{15}$ are logical opposites, only one of NAND gates 104 will be activated. The output of the activated NAND gate 104 is then buffered by a buffer gate 106 to excite the appropriate $X_n$.

In this final selection stage, the signal $A_{15}$ is used to select on which side of the cell matrix the row line is to be excited. In the preferred embodiment, $A_{15}$ is the most significant bit of the eight bit column address signal. Accordingly, $A_{15}$ will be "high" only when the second (right) half of the cell matrix is being addressed. When this occurs, $X_n$ (right) will be excited. Otherwise, $A_{15}$ will be "low" ($\overline{A}_{15}$ "high"), and $X_n$ (left) will be excited. In this fashion, power consumption is reduced because only that half of the matrix which is being addressed is "powered up." In the preferred embodiment, $A_{15}$ indicates which side of the matrix is being addressed (and thus, "powered up"), and correspondingly excites the desired row line solely on that side of the cell matrix by means of NAND gates 104. Of course, any signal indicative of the half of the cell matrix being addressed could be used in the place of illustrative signal $A_{15}$.

In a system having an eight bit row address signal, there will be 256 row address lines such as lines 122, 124, 126 and 130 illustrated in FIG. 2. NAND gates 100 and NOR gates 102 are accordingly laid out on the chip architecture to allow adjacent decoders to be shared as illustrated. For example, the particular $A_4A_5$ and $A_6A_7$ combination decoded by right NAND gate 100 is sent via line 130 to the next adjacent decoder for final stage decoding with a decoded signal from a different $A_0A_1$ and $A_2A_3$ combination than it was originally processed within upper NOR gate 102. Similarly, lower NOR gate 102 receives as one of its inputs the decoded output of a different $A_4A_5$ and $A_6A_7$ combination from the next lower decoder. It will be understood that $X_{N+1}$ is adjacent to $X_N$ in the sense that $X_{N+1}$ is physically next to $X_N$ on the chip. These two lines are not necessarily next to each other in a mathematical sense.

FIG. 4 illustrates a schematic representation of one embodiment of a CMOS implementation of the logic circuitry of FIG. 2 with the corresponding gates bearing like reference numerals.

We claim:

1. In a semiconductor memory device having inputs coupled for receiving coded column and row address data, an improved row decoder comprising:
    a set of predecoding row address circuits having inputs coupled for receiving row address data and providing a set of predecoded row address data;
    a pair of first stage row decoders each having two inputs coupled to receive two respective predetermined ones of said predecoded row address data and providing respective first logic signals at respective outputs of said first stage decoders;
    a second stage row decoder having two inputs coupled to receive said first logic signals and to provide a second logic signal at an output of said second stage decoder; and
    a pair of third stage decoders each having two inputs and each having one of said inputs coupled to receive said second logic signal and each having its other input coupled to receive column address data.

2. In a semiconductor memory device having inputs coupled for receiving coded column and row address data, an improved row decoder comprising:
    a set of predecoding row address circuits having inputs coupled for receiving row address data and providing a set of predecoded row address data;
    a set of first stage row decoders each having two inputs coupled to receive two respective predetermined ones of said predecoded row address data and providing respective first logic signals at respective outputs of said first stage decoders;
    a set of second stage row decoders each having two inputs coupled to receive two respective first logic signals from adjacent first stage row decoders and to provide respective second logic signals at respective outputs of said second stage decoders;
    a set of third stage decoders arranged in pairs, each decoder having two inputs, each of the decoders of each pair having one of said inputs coupled to receive a respective second logic signal and each said decoder having its other input coupled to receive column address data.

3. The decoder of claim 1 wherein each of said first stage, second stage and third stage decoders comprises a respective logic circuit coupled to receive two logic input signals and to provide one logic output signal.

4. The decoder of claim 2 wherein each of said first stage, second stage and third stage decoders comprises a respective logic circuit coupled to receive two logic input signals and to provide one logic output signal.

5. The decoder of claim 2 wherein a first logic stage decoder provides an output which is coupled to the inputs of two second stage row decoders each having respective outputs coupled to four third stage decoders.

6. The decoder according to claim 2 wherein a first group of said third stage decoders includes decoders each having an input coupled to receive a single column address bit, and a second group of decoders each having an input coupled to the logic complement of said column address bit.

7. The decoder according to claim 6 wherein said first group is coupled to receive the most significant column address bit and said second group is coupled to receive the logic complement of said most significant column address bit.

* * * * *